United States Patent
Yu et al.

(10) Patent No.: US 10,147,469 B2
(45) Date of Patent: Dec. 4, 2018

(54) MEMORY DEVICE AND METHOD OF OPERATING SAME

(71) Applicant: TAIWAN SEMICONDUCTOR MANUFACTURING COMPANY, LTD., Hsinchu (TW)

(72) Inventors: Hung-Chang Yu, Hsinchu (TW); Ta-Ching Yeh, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/877,034

(22) Filed: Jan. 22, 2018

(65) Prior Publication Data

US 2018/0151203 A1 May 31, 2018

Related U.S. Application Data

(63) Continuation of application No. 15/460,687, filed on Mar. 16, 2017, now Pat. No. 9,875,774.

(60) Provisional application No. 62/427,700, filed on Nov. 29, 2016.

(51) Int. Cl.
| | |
|---|---|
| *G11C 7/08* | (2006.01) |
| *G11C 5/06* | (2006.01) |
| *G11C 7/10* | (2006.01) |
| *G11C 7/06* | (2006.01) |
| *G11C 7/12* | (2006.01) |

(52) U.S. Cl.
CPC ............. *G11C 7/08* (2013.01); *G11C 5/063* (2013.01); *G11C 7/062* (2013.01); *G11C 7/10* (2013.01); *G11C 7/12* (2013.01); *G11C 2207/06* (2013.01)

(58) Field of Classification Search
CPC ........... G11C 5/063; G11C 7/062; G11C 7/08; G11C 7/10; G11C 7/12; G11C 2207/062
See application file for complete search history.

(56) References Cited

U.S. PATENT DOCUMENTS

| | | |
|---|---|---|
| 6,304,494 B1 | 10/2001 | Arimoto |
| 6,847,566 B1 | 1/2005 | Han et al. |
| 6,903,436 B1 | 6/2005 | Luo et al. |
| 7,196,954 B2 | 3/2007 | Suh |

(Continued)

FOREIGN PATENT DOCUMENTS

| | | |
|---|---|---|
| DE | 11 2004 001 952 | 8/2015 |
| TW | 201515006 | 4/2015 |

OTHER PUBLICATIONS

Office Action dated Jul. 4, 2017 from corresponding application No. DE 10 2017 106 228.9.

(Continued)

*Primary Examiner* — Harry W Byrne
*Assistant Examiner* — Lance Reidlinger
(74) *Attorney, Agent, or Firm* — Hauptman Ham, LLP

(57) ABSTRACT

A semiconductor device including: a sense amplifier; a branched line selectively connectable to the amplifier; a recycling arrangement selectively connectable to the branched line; an array of bit lines connected to corresponding memory cells; a multiplexer configured to selectively connect the branched line to a selected one of the memory cells through a corresponding line amongst the array of bit lines; and a controller configured to control the recycling arrangement and the multiplexer to perform intra-sense-amplifier recycling of a gleaned amount of charge (gleaned charge) recovered from a first read operation to a second read operation.

20 Claims, 13 Drawing Sheets

(56) References Cited

U.S. PATENT DOCUMENTS

| | | |
|---|---|---|
| 8,964,485 B2 | 2/2015 | Yang et al. |
| 2011/0116322 A1 | 5/2011 | Seol et al. |

OTHER PUBLICATIONS

Office Action dated Sep. 20, 2018 from corresponding application No. TW 106120854.

MEMORY DEVICE AND METHOD OF OPERATING SAME

PRIORITY CLAIM

The present application is a continuation of U.S. application Ser. No. 15/460,687, filed Mar. 16, 2017, now U.S. Pat. No. 9,875,774, granted Jan. 23, 2018, which claims the priority of U.S. Provisional Application No. 62/427,700, filed Nov. 29, 2016, which are incorporated herein by reference in their entireties.

BACKGROUND

A memory device includes: an array of memory cells (which are programmable) and a corresponding array of reference memory cells ('memory_bar cells'); a sense amplifier; first and second branched lines connected to corresponding first and second input terminals of the sense amplifier; and an arrangement of bit lines and bit_bar lines which are controllable to selectively connect one of the memory cells and a corresponding one of the memory_bar cells to the first and second branched lines.

A read operation of the sense amplifier includes three modes (as listed in the order of occurrence): a precharge mode; an evaluation mode; and a discharge mode. In the precharge mode, the first and second branched lines are precharged by the sense amplifier. In the discharge mode, the first and second branched lines and a selected one of the bit lines and a corresponding selected one of the bit_bar lines are connected (and thus discharged) to ground. Of the total energy consumed by the sense amplifier, a large portion is attributable to the read operation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
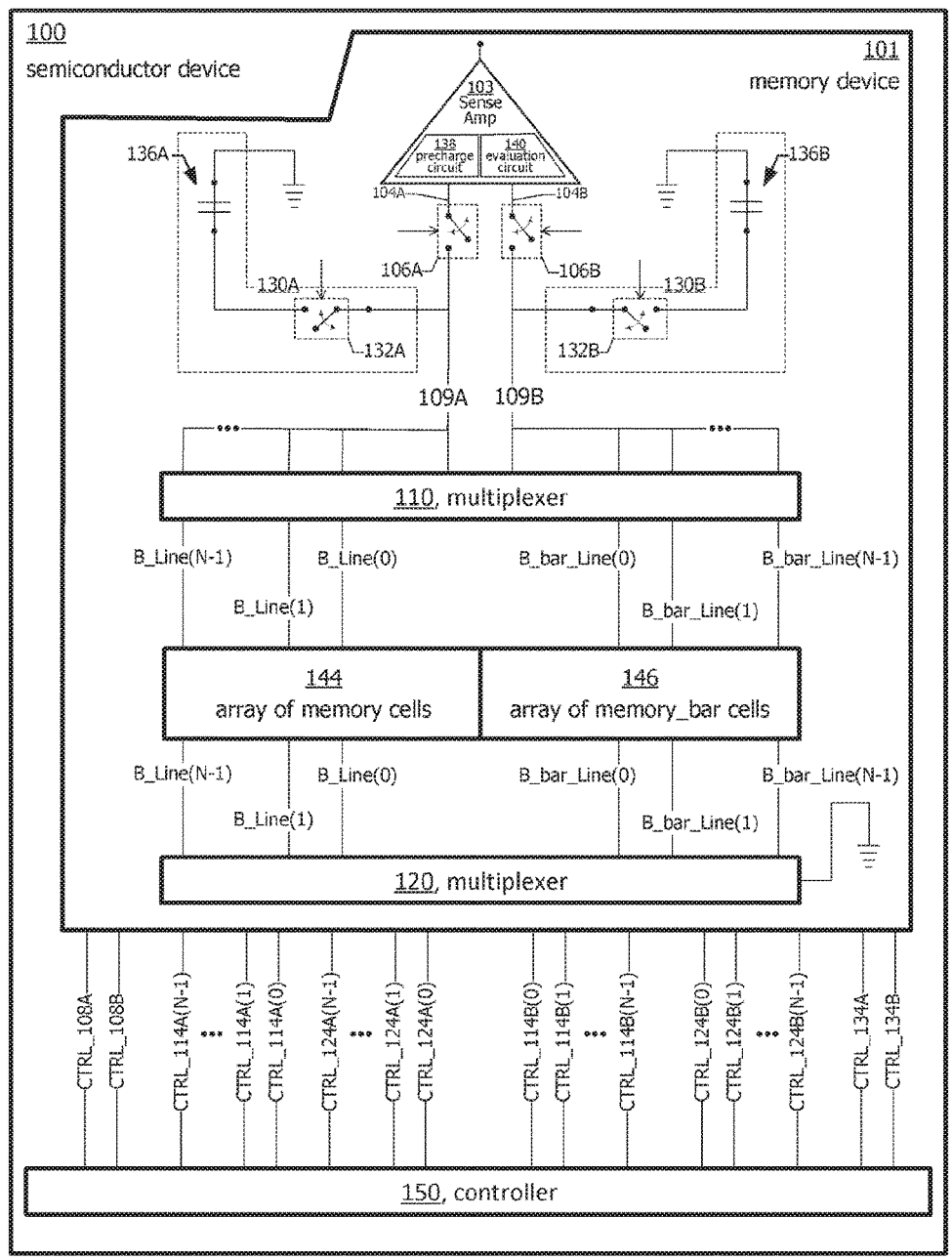
FIG. 1 is a block diagram of a semiconductor device, in accordance with at least one embodiment of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure, in various embodiments, is generally related to a memory device and method of operating the memory device which recycles charge in order to reduce energy consumption during a read operation. In some embodiments, during a recovery phase, first and second charges are recovered (into corresponding first and second capacitors) correspondingly from the selected bit line and the corresponding selected bit_bar line before a drainage phase in which the selected bit line and the corresponding selected bit_bar line are drained to ground. Such a recovery phase has a benefit of reducing amounts of charge which would otherwise be drained to ground, which reduces energy wasted during the subsequent drainage phase, and thus during the read operation. In some embodiments, during a reuse phase, the first and second charges are reused (transferred out of the corresponding first and second capacitors) onto the corresponding first and second branched lines before a pre-fill phase in which the first and second branched lines are pre-filled (to a level of a reference voltage) by the sense amplifier. Such a reuse phase has a benefit of reducing amounts of charge which the sense-amplifier would otherwise provide in order to reach the reference voltage on the corresponding first and second branched lines, which reduces energy consumed during the subsequent pre-fill phase, and thus during the read operation.

FIG. 1 is a block diagram of a semiconductor device 100, in accordance with at least one embodiment of the present disclosure.

Semiconductor device 100 includes a memory 101 and a controller 150. Memory device 101 is similar to memory device 301 of FIGS. 3A-3J (which is described in detail below). Memory device 101 includes: a sense amplifier 103; terminal switches 106A-106B; branch lines 109A-109B; a multiplexer 110; a first array of bit lines B_Line(0)-B_Line(N−1) and a corresponding second array of bit_bar lines B_bar_Line(0)-B_bar_Line(N−1), where N is a positive integer and N≥2; a multiplexer 120; a first recycling arrangement 130A; and a second recycling arrangement 130B. For the sake of brevity of description, the discussion of FIG. 1 will focus on differences between FIG. 1 and FIGS. 3A-3J (again, described below).

Memory device 301 includes a first array 144 of memory cells and a corresponding second array 146 of reference memory cells (again, 'memory_bar cells'). A first array of bit lines B_Line(0)-B_Line(N−1) is shown as connecting to array 144 of memory cells. A second array of bit_bar lines B_bar_Line(0)-B_bar_Line(N−1) is shown as connecting to array 146 of memory_bar cells. In some embodiments, controller 150 generates control signals CTRL_108A, CTRL_108B, CTRL_114A(0)-CTRL_114A(N−1), CTRL_124A(0)-CTRL_124A(N−1), CTRL_114B(0)-CTRL_114B(N−1), CTRL_124B(0)-CTRL_124B(N−1), CTRL_134A-CTRL134B, and CTRL_134A bar & CTRL134B_bar so as to implement phases 302A-302J of read operations of corresponding FIGS. 3A-3J (discussed below).

Figure 2:
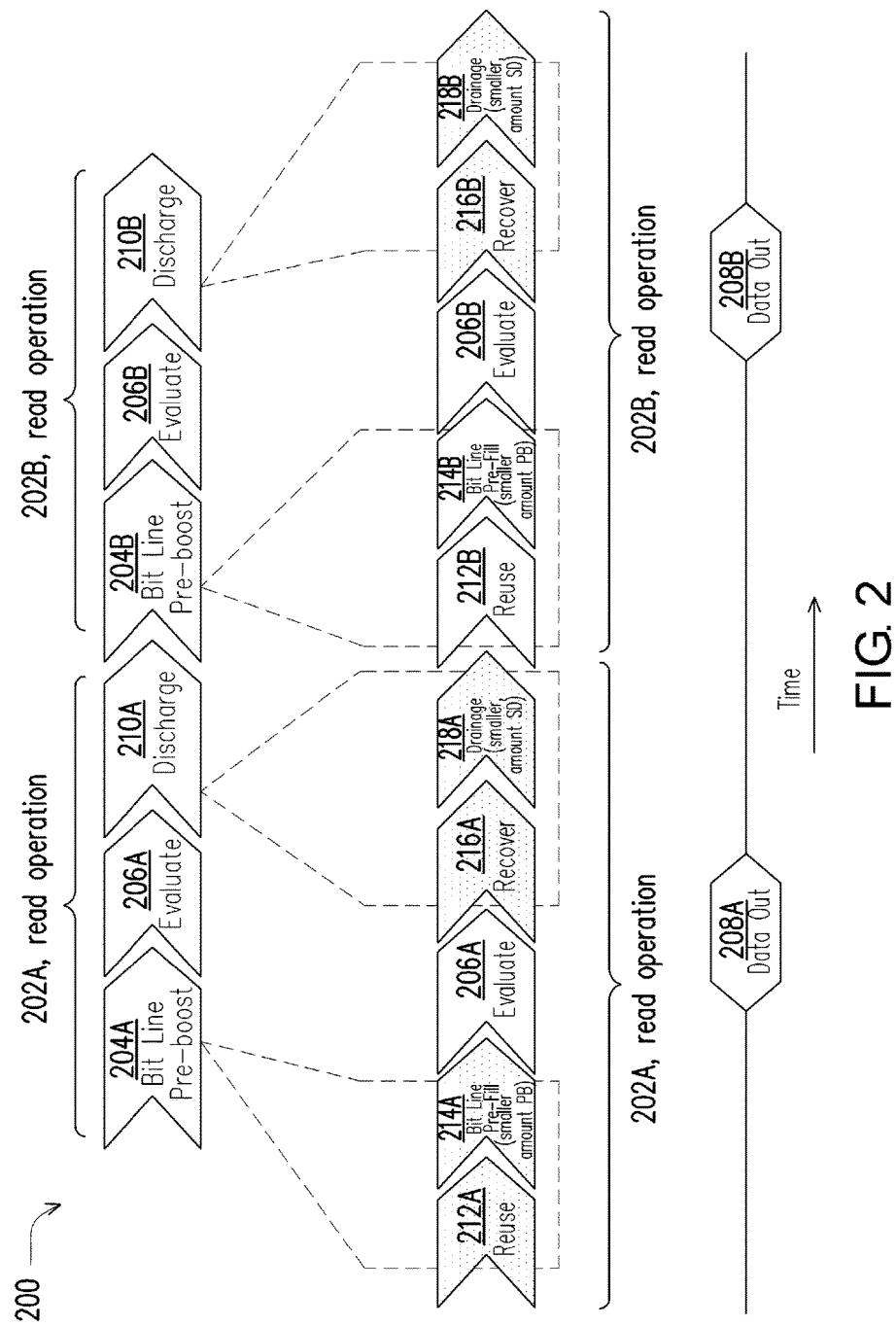
FIG. 2 is a diagram of a read-operation phase-flow for a memory device, in accordance with at least one embodiment of the present disclosure.

FIG. 2 is a diagram of a read-operation phase-flow 200 for a memory device (not illustrated in FIG. 2), in accordance with at least one embodiment of the present disclosure. Additional phases can be provided before, during, and/or after the phase-flow 200.

In FIG. 2, for simplicity of illustration, two read operations 202A and 202B are shown in phase-flow 200. In some embodiments, other quantities of read operations are included in phase-flow 200.

FIG. 2 assumes a context in which the memory device (not illustrated in FIG. 2) includes: an array of memory cells (which are programmable) and a corresponding array of reference memory cells ('memory_bar cells'); a sense amplifier; first and second branched lines connected to corresponding first and second input terminals of the sense amplifier; an arrangement of bit lines and bit_bar lines which are controllable to selectively connect one of the memory cells and a corresponding one of the memory_bar cells to the first and second branched lines; and first and second capacitors selectively connectable to the first and second branched lines. Also, for simplicity of illustration, read operations 202A and 202B are labeled 'bit line' in corresponding phases 204A, 204B, 214A, and 214B. It is to be understood that each phase in phase-flow 200 concerns not only a selected one of the bit lines and/or the corresponding first branched line, but also the selected one of the corresponding bit_bar lines and/or or the corresponding second branched line.

Read operation 202A includes: a bit line pre-boost phase 204A; an evaluation phase 206A which follows bit line pre-boost phase 204A; and a discharge phase 210A which follows evaluation phase 206A. Similarly, read operation 202B includes: a bit line pre-boost phase 204B; an evaluation phase 206B which follows bit line pre-boost phase 204B; and a discharge phase 210B which follows evaluation phase 206B. In some embodiments, read operations 202A-202B are instances of a cyclic general read cycle.

The sense amplifier (103 in FIG. 1) is configured, in evaluation phase 206A to compare voltages provided by a selected one of the memory cells (as connected through a corresponding one of the bit lines and the first branched line) and a corresponding selected one of the memory_bar cells (as connected through a corresponding one of the bit_bar lines and the second branched line). Based on the comparison, the sense amplifier generates an output indicating a particular logic state stored in the selectively connected one of the memory cells. In phase-flow 200, the output of read operation 202A is shown as a pulse 208A of data, and the output of read operation 202B is shown as a pulse 208B of data.

In contrast to another precharge mode, pre-boost phase 204A according to an embodiment includes two phases, namely a reuse phase 212A and a bit line pre-fill phase 214A. Similarly, pre-boost phase 204B includes two phases, namely a reuse phase 212B and a bit line pre-fill phase 214B.

In some embodiments, during reuse phase 212A, first and second charges in the first and second capacitors are reused (transferred out of the corresponding first and second capacitors) onto the corresponding first and second branched lines before pre-fill phase 214A in which the first and second branched lines are pre-filled (to a level of a reference voltage) by the sense amplifier. For brevity, a corresponding discussion of reuse phase 212B is omitted here (but see the discussion below). Each of reuse phases 212A-212B has a benefit of reducing amounts of charge which the sense-amplifier would otherwise provide in order to reach the reference voltage on the corresponding first and second branched lines, which reduces energy consumed subsequently during corresponding pre-fill phases 214A-214B, and thus during the read operation. Whereas a read operation by a sense amplifier according to another approach would include three modes (precharge, evaluate and discharge) and would provide an amount of charge PC during the precharge mode of the other approach (where PC represents about 67.5% of the total charge consumed during the read operation according to the other approach), during a pre-fill phase according to an embodiment, e.g., pre-fill phase 214A, the sense amplifier provides an amount of charge PB, where PB<PC.

In terms of delay, it is noted that though the singular precharge mode of other approaches is replaced by two phases in accordance with an embodiment, e.g., reuse phase 212A and pre-fill phase 214A, because reuse phase 212A reduces the amount of charge which the sense-amplifier provides subsequently during pre-fill phase 214A, the length of time needed by the sense amplifier in which to provide the reduced amount of charge during pre-fill phase 214A is shorter than the duration of the singular precharge mode of the other approaches. The time saved by the shorter pre-fill phase 214A according to an embodiment, when combined with the length of time needed to complete reuse phase 212A is typically no longer than the duration of the precharge mode of the other approaches. In some embodiments, the aggregate time for reuse phase 212A and pre-fill phase 214A according to an embodiment is smaller than the duration of the precharge mode of the other approaches.

In contrast to a discharge mode of other approaches, discharge phase 210A according to an embodiment includes two phases, namely, a recover phase 216A and a drainage phase 218A. Similarly, discharge phase 210B includes two phases, namely, a recover phase 216B and a drainage phase 218B.

In some embodiments, during recovery phase 216A, charges are gleaned resulting in gleaned charges, e.g., first and second charges are recovered (into the corresponding first and second capacitors) correspondingly from (A) the selected bit line and the first branched line and (B) the corresponding selected bit_bar line and the second branched line before drainage phase 218A in which (A) the selected bit line and the first branched line and (B) the corresponding selected bit_bar line and the second branched line are drained to ground. For brevity, a discussion of drainage phase 218B is omitted here (but see the discussion below). Each of recovery phases 216A-216B has a benefit of reducing amounts of charge which would otherwise be drained to ground, which reduces energy wasted during the subsequent drainage phase, and thus during the read operation.

In terms of delay, it is noted that though the singular discharge mode of other approaches is replaced by two phases in accordance with an embodiment, e.g., recover phase 216A and drainage phase 218A, because recover phase 216A reduces the amount of charge which is drained to ground subsequently during drainage phase 218A, the length of time needed in which to drain charge to ground during drainage phase 218A in accordance with an embodiment is shorter than the duration of the discharge mode of the other approaches. The time saved by the shorter drainage phase 218A in accordance with an embodiment, when combined with the length of time needed to complete recover phase 216A is typically no longer than the duration of the discharge mode of the other approaches. In some embodiments, the aggregate time for recover phase 216A and drainage phase 218A in accordance with an embodiment is smaller than the duration of the discharge mode of the other approaches.

FIGS. 3A-3J are block diagrams of a memory device 301 at corresponding phases 302A-302J of read operations, in accordance with at least one embodiment of the present disclosure. Reference numerals in FIGS. 3A-3J correspond to reference numerals in FIG. 1 albeit increased by 300.

Generally, in FIGS. 3A-3J, read operations phases 302A-302J correspond, e.g., to phases 214A, 206A, 216A-218A, 212B-214B, 206B, 216B-218B and 212A of FIG. 2.

Figure 3A:
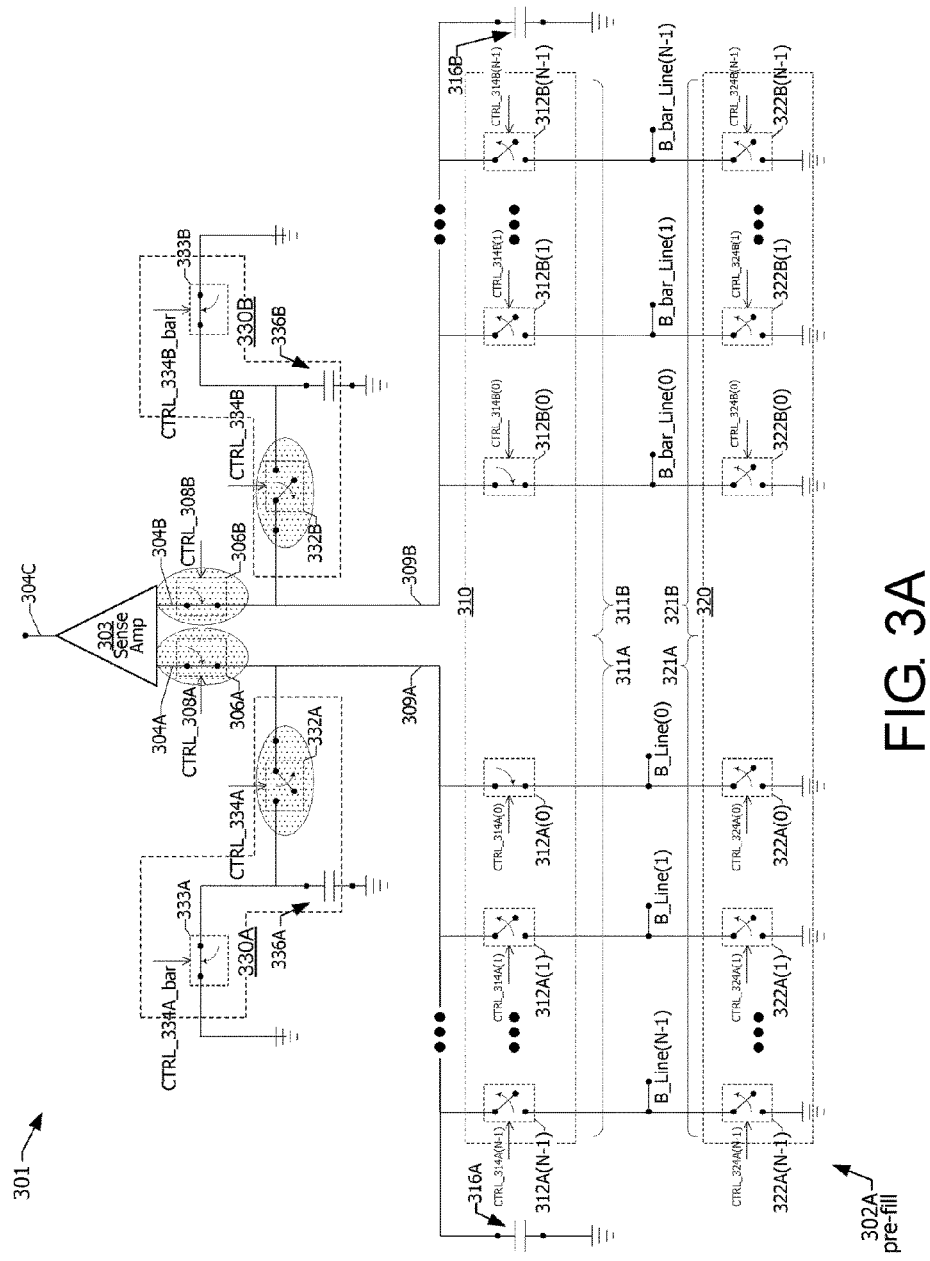
FIGS. 3A-3J are block diagrams of a memory device at corresponding phases of read operations, in accordance with at least one embodiment of the present disclosure.

In FIG. 3A, memory device 201 is shown in pre-fill phase 302A, which corresponds, e.g., to pre-fill phase 214A of FIG. 2.

Memory device 301 includes: a sense amplifier 303; terminal switches 306A-306B; branch lines 309A-309B; a multiplexer 310; a first array of bit lines B_Line(0)-(B_Line(N−1) and a corresponding second array of bit_bar lines B_bar_Line(0)-B_bar_Line(N−1), where N is a positive integer and N≥2; a multiplexer 320; and capacitors 336A-336B. Sense amplifier 303 has input terminals 304A-304B and an output terminal 304C. Sense amplifier 303 includes a precharge circuit (138 in FIG. 1) and an evaluation circuit (140 in FIG. 1). In some embodiments, sense amplifier 303 is a differential amplifier. In some embodiments, sense amplifier 303 is a non-differential amplifier. Bit lines B_Line(0)-B_Line(N−1) are connected to corresponding memory cells (array 144 in FIG. 1). Bit_bar lines B_bar_Line(0)-B_bar_Line(N−1) are connected to corresponding memory_bar cells (array 146 in FIG. 1).

Terminal switches 306A-306B are: connected between corresponding terminals 304A-304B and corresponding branched lines 309A-309B; and are controlled by corresponding control signals CTRL_308A-CTRL_308B. Terminal switch 306A is connected between terminal 304A and branched line 309A. Terminal switch 306A is controlled by control signal CTRL_308A. Terminal switch 306B is similarly connected with terminal 304B and branched line 309B. Terminal switch 306B is controlled by control signal CTRL_308B. Multiplexer 310 is organized into a first bank 311A and a second bank 311B. Bank 311A of multiplexer 310 is connected between branched line 309A and a first array of bit lines B_Line(0)-B_Line(N−1). Bank 311B of multiplexer 310 is connected between branched line 309B and a second array of bit_bar lines B_bar_Line(0)-B_bar_Line(N−1). In some embodiments, multiplexer 310 is replaced by two multiplexers, a first one of the multiplexers corresponding to bank 311A, and a second one of the multiplexers corresponding to bank 311B.

Bank 311A of multiplexer 310 includes leg switches 312A(0)-312A(N−1). Bank 311B of multiplexer 310 includes leg switches 312B(0)-312B(N−1). Leg switches 312A(0)-312A(N−1) and 312B(0)-312B(N−1) are controlled by corresponding control signals CTRL_314A(0)-CTRL_314A(N−1) and CTRL_314B(0)-CTRL_314B(N−1).

Multiplexer 320 is organized into a first bank 321A and a second bank 321B. Bank 321A is connected between bit lines B_Line(0)-B_Line(N−1) and ground. Bank 321B is connected between bit_bar lines B_bar_Line(0)-B_bar_Line(N−1) and ground. In some embodiments, multiplexer 320 is replaced by two multiplexers, a first one of the multiplexers corresponding to bank 321A, and a second one of the multiplexers corresponding to bank 321B.

Bank 321A of multiplexer 320 includes drain switches 322A(0)-322A(N−1). Bank 321B of multiplexer 320 includes drain switches 322B(0)-322B(N−1). Drain switches 322A(0)-322A(N−1) and 322B(0)-322B(N−1) are controlled by corresponding control signals CTRL_324A(0)-CTRL_324A(N−1) and CTRL_324B(0)-CTRL_324B(N−1).

Memory device 301 also includes recycle switches 332A-332B and drain switches 333A-333B. Together, recycle switch 332A, drain switch 333A and capacitor 336A comprise a first recycling arrangement 330A. Together, recycle switch 332B, drain switch 333B and capacitor 336B comprise a second recycling arrangement 330B.

Recycle switches 332A-332B, which include corresponding control terminals, are controlled by corresponding control signals CTRL_334A and CTRL_334B. Drain switches 333A-333B are controlled by corresponding control signals CTRL_334A_bar and CTRL_334B_bar. In some embodiments, control signals control signals CTRL_334A_bar and CTRL_334B bar are the inverse of corresponding control signals CTRL_334A and CTRL_334B. First terminals of recycle switches 332A-332B are connected to corresponding branched lines 309A-309B. Second terminals of recycle switches 332A-332B are connected to first plates of corresponding capacitors 336A-336B. Second plates of capacitors 336A-336B are connected to ground. First terminals of drain switches 333A-333B are connected to first plates of corresponding capacitors 336A-336B. Second terminals of drain switches 333A-333B are connected to ground.

Parasitic capacitance of branched line 309A alone or when connected to a selected one of bit lines B_Line(0)-B_Line(N−1) is represented by a capacitor 336A connected between branched line 309A and ground. Parasitic capacitance of branched line 309B alone or when connected to a selected one of bit_bar lines B_bar_Line(0)-B_bar_Line(N−1) is represented by a capacitor 336B connected between branched line 309A and ground. Details regarding arrangements and read operations of memory devices, in general, are found in U.S. Pat. No. 8,964,485, granted Feb. 24, 2015, and U.S. Pat. No. 6,903,436, granted Jun. 7, 2005, the entirety of each of which is hereby incorporated by reference.

In pre-fill phase 302A, all drain switches 322A(0)-322A(N−1) and 322B(0)-322B(N−1) are controlled to be open, thereby disconnecting bit lines B_Line(0)-B_Line(N−1) and bit_bar lines B_bar_Line(0)-B_bar_Line(N−1) from ground. Leg switches 312A(0) and 312B(0) are controlled to be closed, thereby connecting bit line B_Line(0) and bit_bar line B_bar_Line(0) to corresponding branched lines 309A-309B. Also, leg switches 312A(1)-312A(N−1) and 312B(1)-312B(N−1) are controlled to be open, thereby disconnecting bit lines B_Line(1)-B_Line(N−1) and bit_bar lines B_bar_Line(1)-B_bar_Line(N−1) from corresponding branched lines 309A-309B.

Furthermore, in pre-fill phase 302A, recycle switches 332A-332B are controlled to be open, thereby disconnecting capacitors 336A-336B from corresponding branched lines 309A-309B. Also, terminal switches 306A-306B are controlled to be closed, thereby connecting terminals 304A-

304B of sense amplifier 303 to corresponding branched lines 309A-309B. As such, in pre-fill phase 302A, sense amplifier 304A provides amounts of charge to adjust voltages on corresponding branched lines 309A-309B to a level of a reference voltage.

During pre-fill phase 302A, the precharge circuit (138 in FIG. 1) in sense amplifier 303 provides the noted amounts of charge. Leg switches 312A(0) and 312B(0) are controlled to be closed. Consequently, a resultant charge and a resultant_bar charge accumulate on the corresponding first and second line pairs and thus at corresponding terminals 304A-304B of sense amplifier 303.

Assuming that pre-fill phase 302A follows a reuse phase not illustrated in FIGS. 3A-3J, accordingly it is assumed that drain switches 322A(0)-322A(N−1) and 322B(0)-322B(N−1) and leg switches 312A(0)-312A(N−1) and 312B(0)-312B(N−1) do not change state in the transition from the preceding reuse phase (not illustrated in FIGS. 3A-3J) to pre-fill phase 300A. In contrast, recycle switches 332A-332B and terminal switches 306A-306B do change state in the transition from the preceding reuse phase (not illustrated in FIGS. 3A-3J) to pre-fill phase 300A. A state transition of any switch in general in FIGS. 3A-3J, and in particular recycle switches 332A-332B and terminal switches 306A-306B in FIG. 3A, is called out by a stippled ellipse shown under the state-transitioning switch.

Figure 3B:
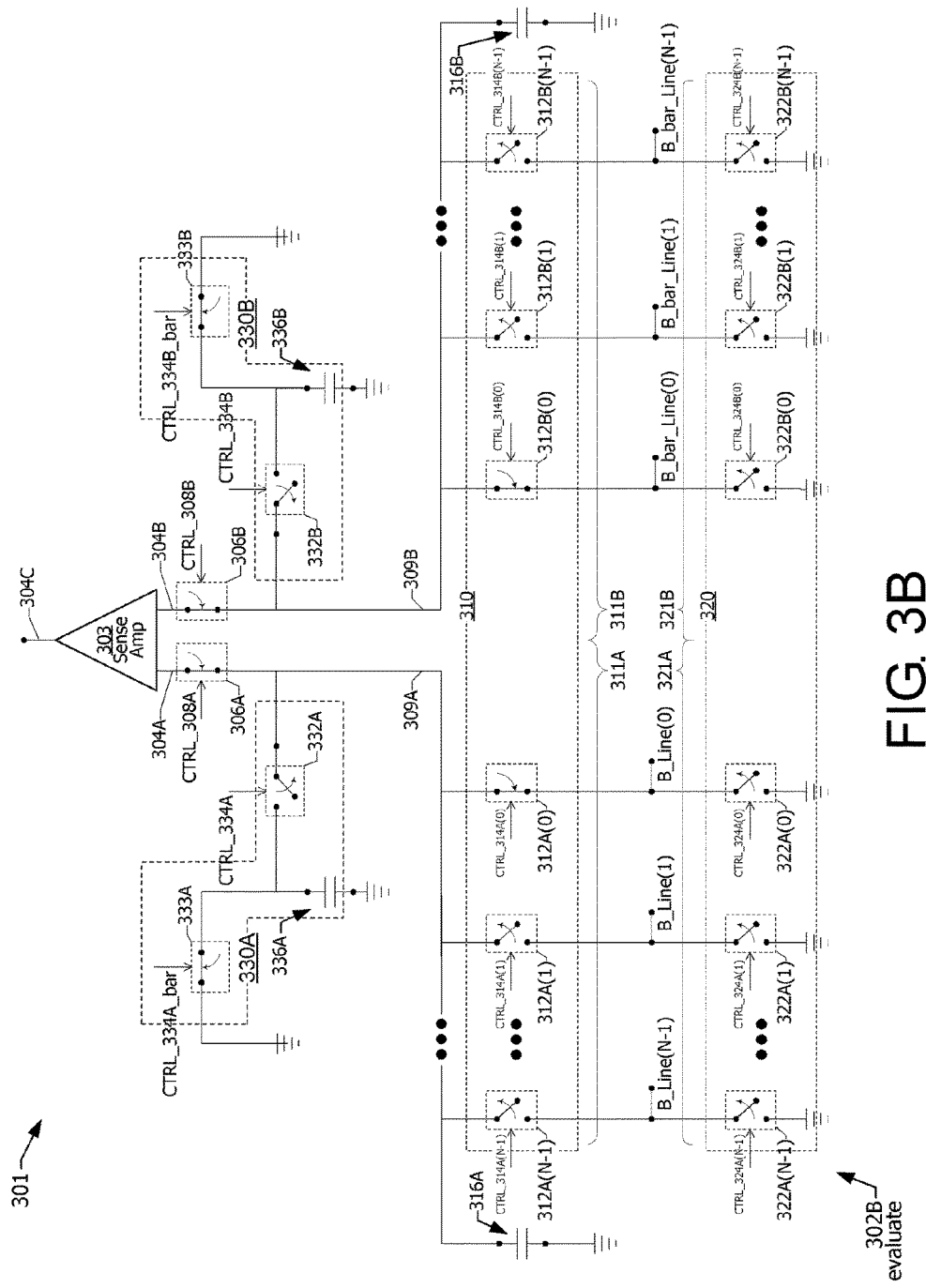

In FIG. 3B, memory device 301 is shown in evaluation phase 302B, which corresponds, e.g., to evaluation phase 206A of FIG. 2.

In evaluation phase 302B, none of the switches change state relative to pre-fill phase 302A. However, rather than the precharge circuit (138 in FIG. 1) in sense amplifier 303 that was used in pre-fill phase 302A, the evaluation circuit (140 in FIG. 1) in sense amplifier 303 is used in evaluation phase 302B. Hence, evaluation phase 302B is considered to be a different state than evaluation phase 302A despite the absence of changes in switch states between evaluation phase 302B and pre-fill phase 302A.

The resultant charge and the resultant_bar charge on corresponding terminals 304A-304B are compared by the evaluation circuit (140 in FIG. 1) in sense amplifier 303 in evaluation phase 302B. Based on the comparison, sense amplifier 303 generates a signal on output terminal 304C indicating a particular logic state stored in the memory cell connected to bit line B_Line(0).

Figure 3C:
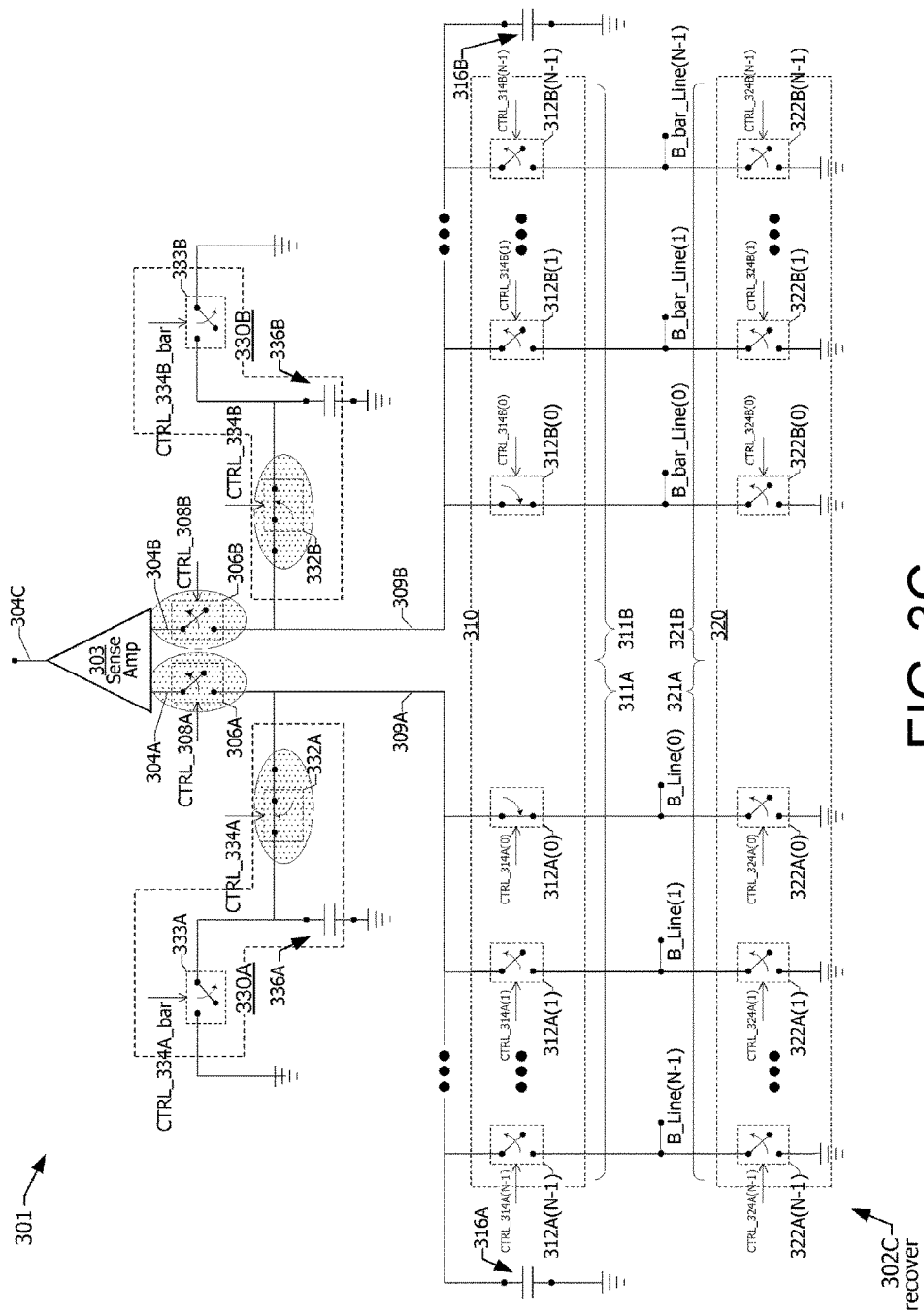

In FIG. 3C, memory device 301 is shown in recover phase 302C, which corresponds, e.g., to recover phase 216A of FIG. 2.

In recover phase 302C, terminal switches 306A-306B are controlled to be open, thereby disconnecting terminals 304A-304B of sense amplifier 303 from corresponding branched lines 309A-309B. Also in recover phase 302C, recycle switches 332A-332B are controlled to be closed, thereby connecting capacitors 336A-336B to corresponding branched lines 309A-309B of the first and second line pairs. First and second charges are transferred (or 'recovered') into capacitors 336A-336B correspondingly from the first line pair (in recover phase 302C, represented by bit line B_Line(0) and branched line 309A) and the second line pair (in recover phase 302C, represented by bit_bar line B_bar_Line(0) and branched line 309B).

Figure 3D:
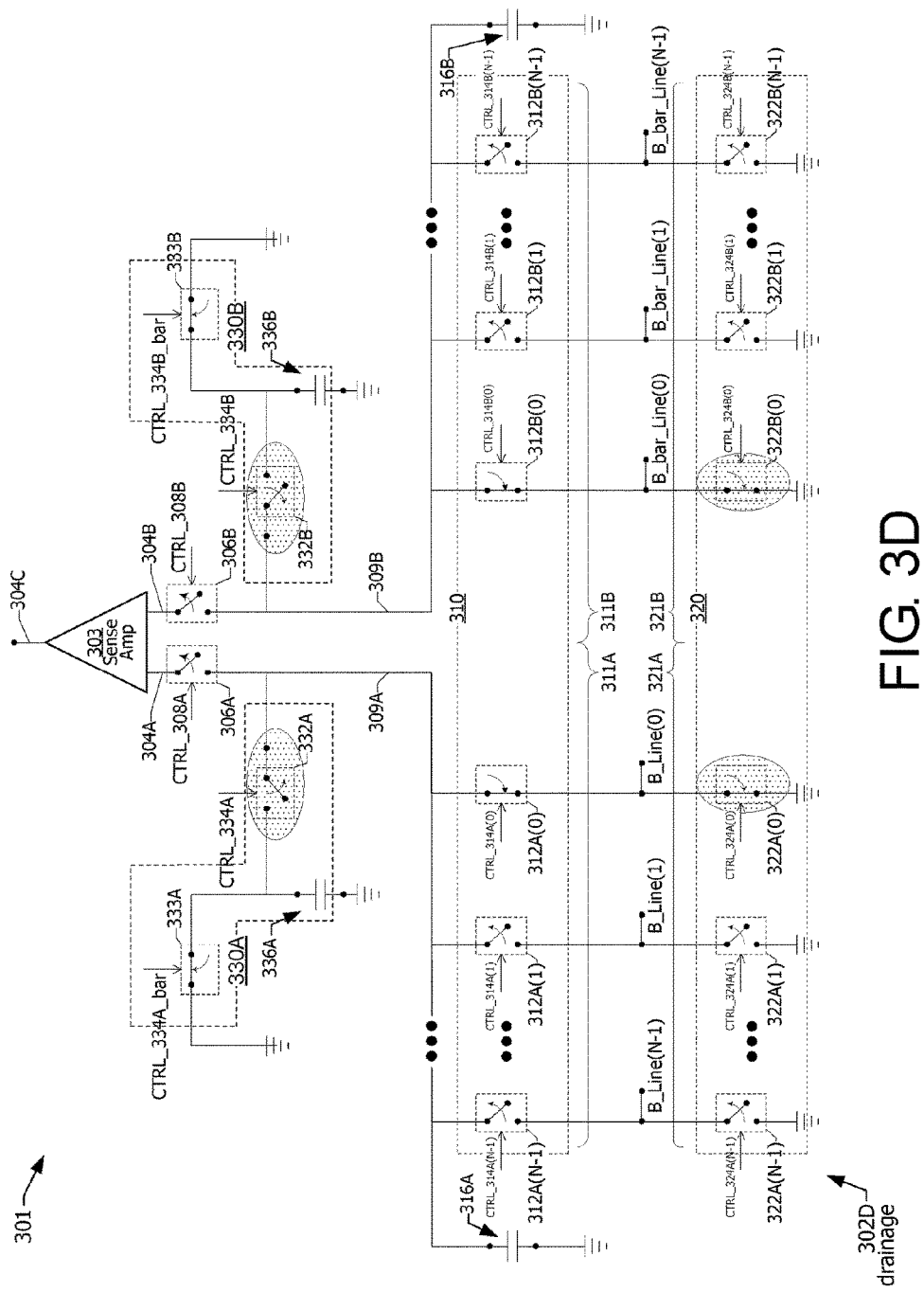

In FIG. 3D, memory device 301 is shown in drainage phase 302D, which corresponds, e.g., to drainage phase 218A of FIG. 2.

In drainage phase 302D, recycle switches 332A-332B are controlled to be open, thereby disconnecting capacitors 336A-336B from corresponding branched lines 309A-309B of the first and second line pairs. Consequently, the first and second charges remain stored in capacitors 336A-336B. In contrast to the noted discharge mode of other approaches (see discussion above) which must discharge relatively larger amounts of charge, when capacitors 336A-336B are disconnected, relatively small first and second amounts of charge (residual charges) remain on the corresponding first line pair (in drainage phase 302D, represented by bit line B_Line(0) and branched line 309A) and the second line pair (in drainage phase 302D, represented by bit_bar line B_bar_Line(0) and branched line 309B).

Also in drainage phase 302D, drain switches 322A(0) and 322B(0) are controlled to be closed. Consequently, bit line B_Line(0) (and thus the first line pair including branched line 309A) and bit_bar line B_bar_Line(0) (and thus the second line pair including branched line 309B) are connected to ground, which removes the first and second residual charges from the first and second line pairs.

Figure 3E:
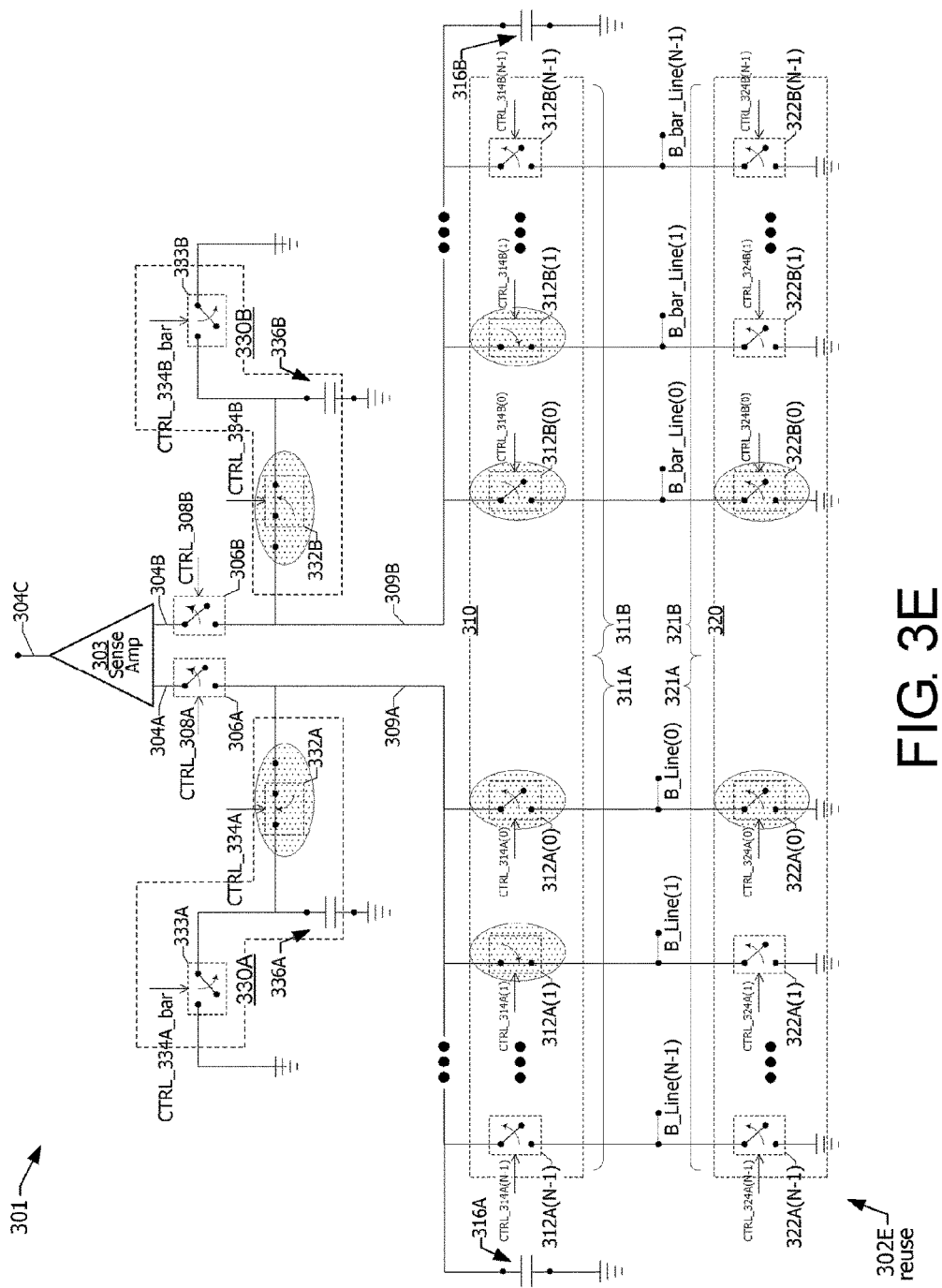

In FIG. 3E, memory device 301 is shown in reuse phase 302E, which corresponds, e.g., to reuse phase 212B of FIG. 2.

In reuse phase 302E, drain switches 322A(0) and 322B(0) are controlled to be open. Consequently, bit line B_Line(0) and bit_bar line B_bar_Line(0) are disconnected from ground. Leg switches 312A(0) and 312B(0) are controlled to be open. Consequently, bit line B_Line(0) and bit_bar line B_bar_Line(0) are disconnected from corresponding branched lines 309A-309B. Leg switches 312A(1) and 312B(1) are controlled to be closed. Consequently, bit line B_Line(1) and bit_bar line B_bar_Line(1) are connected to corresponding branched lines 309A-309B to form new first and second line pairs.

Also in reuse phase 302E, recycle switches 332A-332B are controlled to be closed, thereby connecting capacitors 336A-336B to corresponding branched line 309A of the first line pair (and thus, in reuse phase 302E, also to bit line B_Line(1)) and branched line 309B of the second line pair (and thus, in reuse phase 302E, also to bit_bar line B_bar_Line(1)). Consequently, the first and second charges stored in capacitors 336A-336B are transferred onto the corresponding first and second line pairs.

Figure 3F:
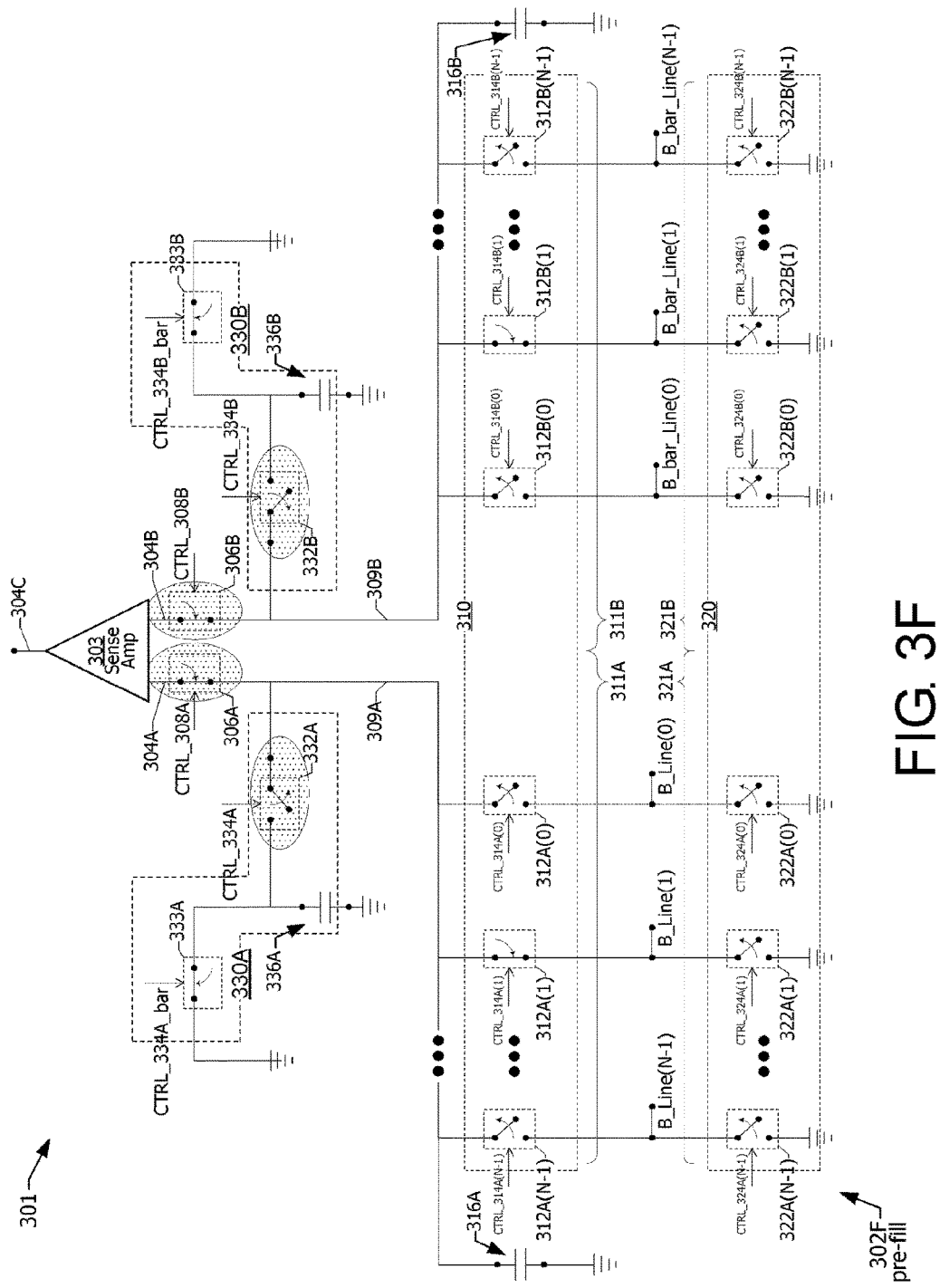

In FIG. 3F, memory device 301 is shown in pre-fill phase 302F, which corresponds, e.g., to pre-fill phase 214B of FIG. 2.

In pre-fill phase 302F, recycle switches 332A-332B are controlled to be open, thereby disconnecting capacitors 336A-336B from corresponding branched lines 309A-309B. Also, terminal switches 306A-306B are controlled to be closed, thereby connecting terminals 304A-304B of sense amplifier 303 to corresponding branched lines 309A-309B. As such, in pre-fill phase 302F, the precharge circuit (138 in FIG. 1) in sense amplifier 304A provides amounts of charge to adjust voltages on corresponding branched lines 309A-309B to a level of a reference voltage. Consequently, a resultant charge and a resultant_bar charge accumulate on the corresponding branched line 309A of first line pair (and thus, in pre-fill phase 302F, also on bit line B_Line(1)) and branched line 309B of the second line pair (and thus, in reuse phase 302E, also on bit_bar line B_bar_Line(1)).

Figure 3G:
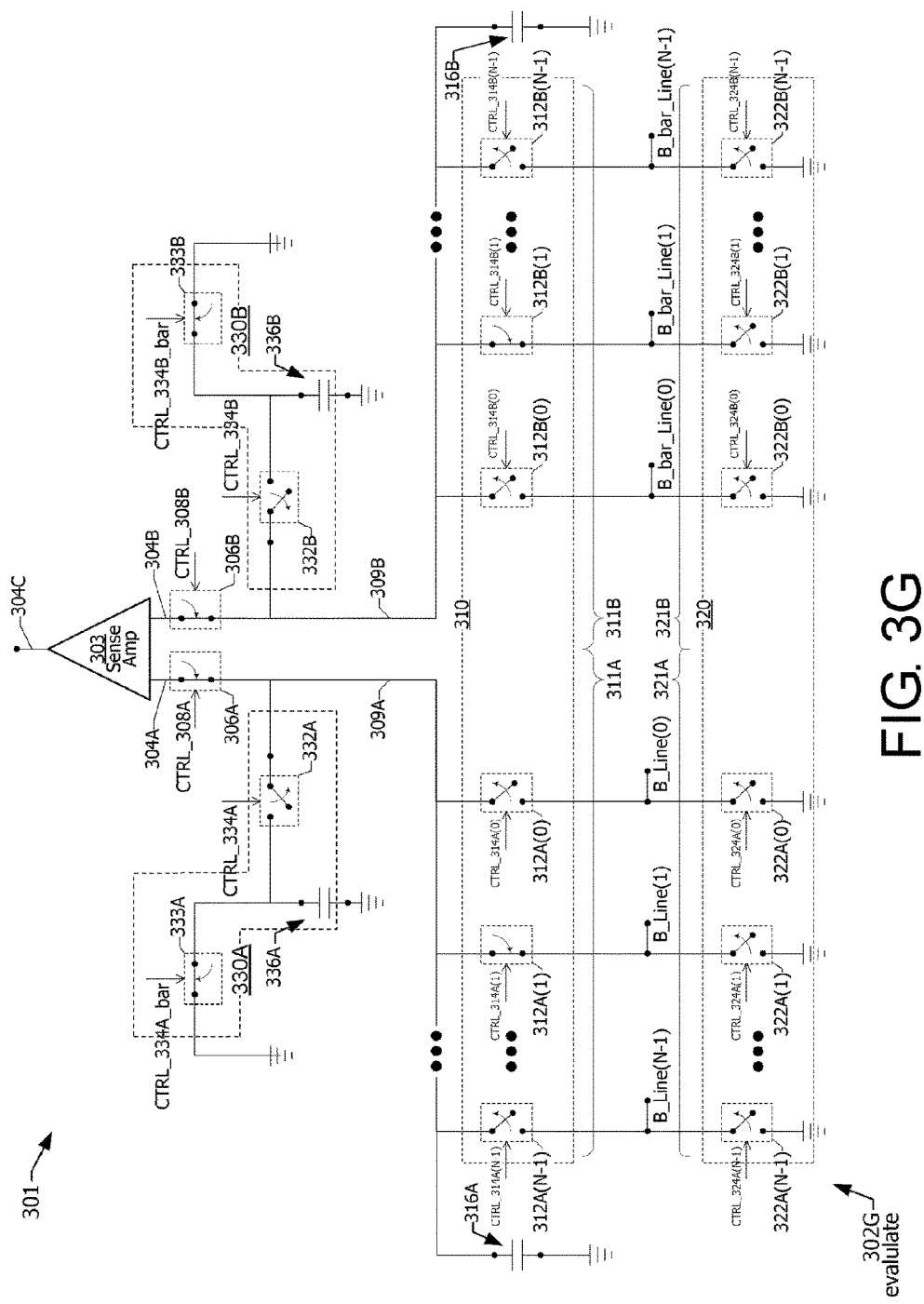

In FIG. 3G, memory device 301 is shown in evaluation phase 302G, which corresponds, e.g., to evaluation phase 206B of FIG. 2.

In evaluation phase 302G, none of the switches change state relative to pre-fill phase 302F. However, rather than the precharge circuit (138 in FIG. 1) in sense amplifier 303 that was used in pre-fill phase 302F, the evaluation circuit (140 in FIG. 1) in sense amplifier 303 is used in evaluation phase 302G. Hence, evaluation phase 302G is considered to be a different state than evaluation phase 302F despite the absence of changes in switch states between evaluation phase 302F and pre-fill phase 302G.

The resultant charge and the resultant_bar charge on corresponding terminals 304A-304B are compared by the evaluation circuit (140 in FIG. 1) in sense amplifier 303 in evaluation phase 302G. Based on the comparison, sense amplifier 303 generates a signal on output terminal 304C indicating a particular logic state stored in the memory cell connected to bit line B_Line(1).

Figure 3H:
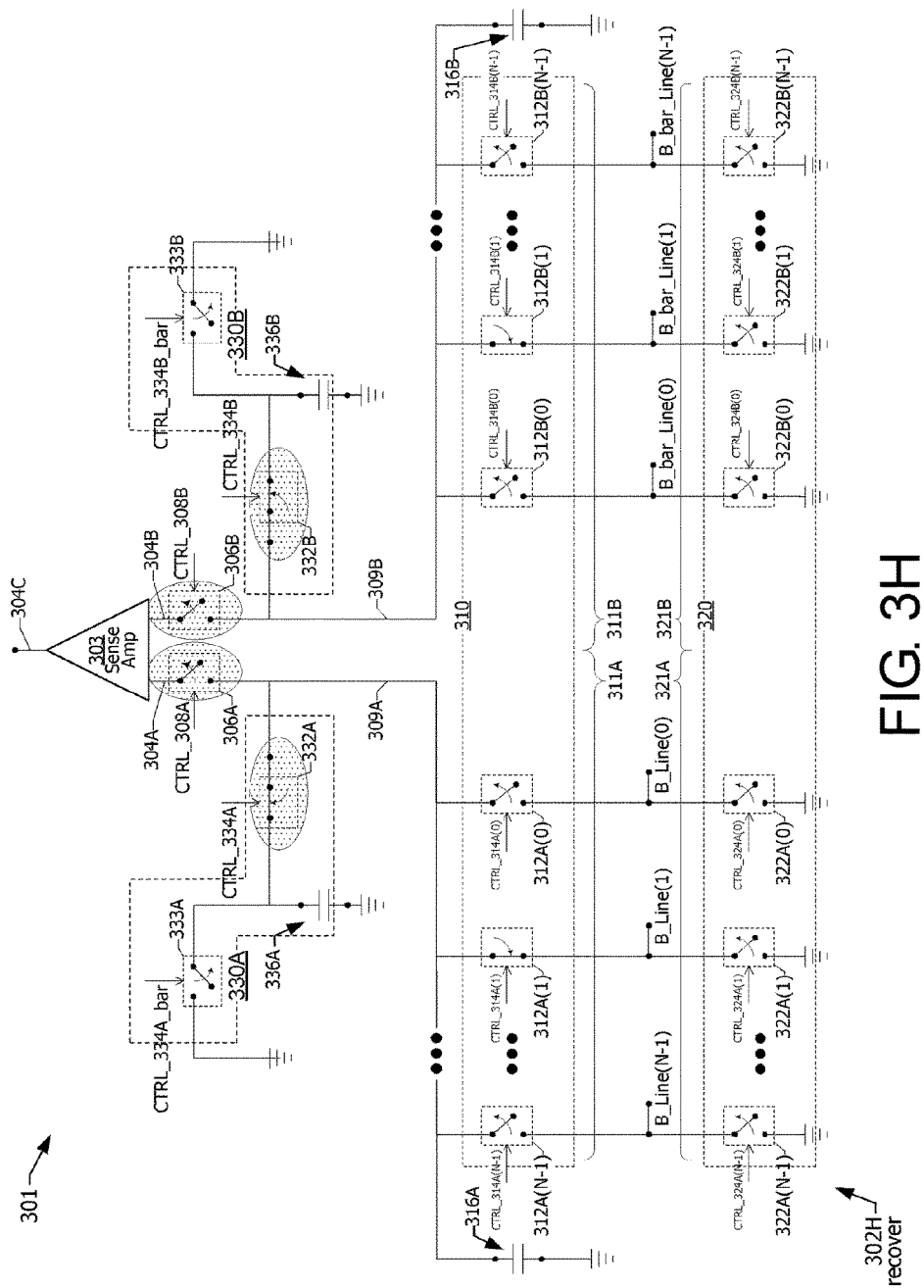

In FIG. 3H, memory device 301 is shown in recover phase 302H, which corresponds, e.g., to recover phase 216B of FIG. 2.

In recover phase 302H, terminal switches 306A-306B are controlled to be open, thereby disconnecting terminals 304A-304B of sense amplifier 303 from corresponding branched lines 309A-309B. Also in recover phase 302H, recycle switches 332A-332B are controlled to be closed, thereby connecting capacitors 336A-336B to corresponding branched lines 309A-309B of the first and second line pairs. First and second charges are transferred (or 'recovered') into capacitors 336A-336B correspondingly from the first line pair (in recover phase 302H, represented by bit line B_Line (1) and branched line 309A) and the second line pair (in recover phase 302C, represented by bit_bar line B_bar_Line (1) and branched line 309B).

Figure 3I:
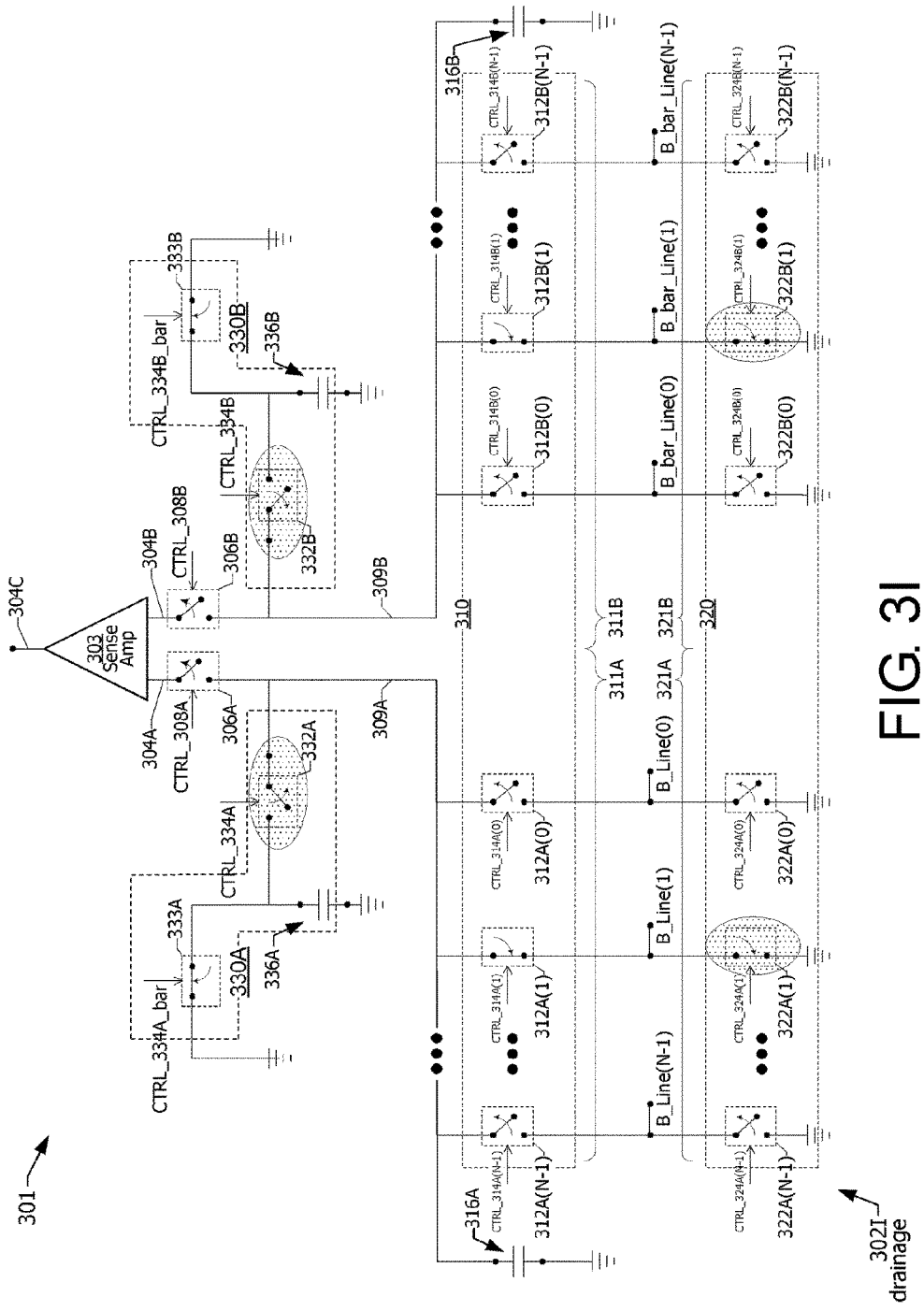

In FIG. 3I, memory device 301 is shown in drain or drainage phase 302I, which corresponds, e.g., to drainage phase 218B of FIG. 2.

In drainage phase 302I, recycle switches 332A-332B are controlled to be open, thereby disconnecting capacitors 336A-336B from corresponding branched lines 309A-309B of the first and second line pairs. Consequently, the first and second charges remain stored in capacitors 336A-336B. When capacitors 336A-336B are disconnected, relatively small first and second residual charges remain on the corresponding first line pair (in drainage phase 302I, represented by bit line B_Line(1) and branched line 309A) and the second line pair (in drainage phase 302I, represented by bit_bar line B_bar_Line(1) and branched line 309B).

Also in drainage phase 302I, drain switches 322A(1) and 322B(1) are controlled to be closed. Consequently, bit line B_Line(1) (and thus the first line pair including branched line 309A) and bit_bar line B_bar_Line(1) (and thus the second line pair including branched line 309B) are connected to ground, which removes the first and second residual charges from the first and second line pairs.

Figure 3J:
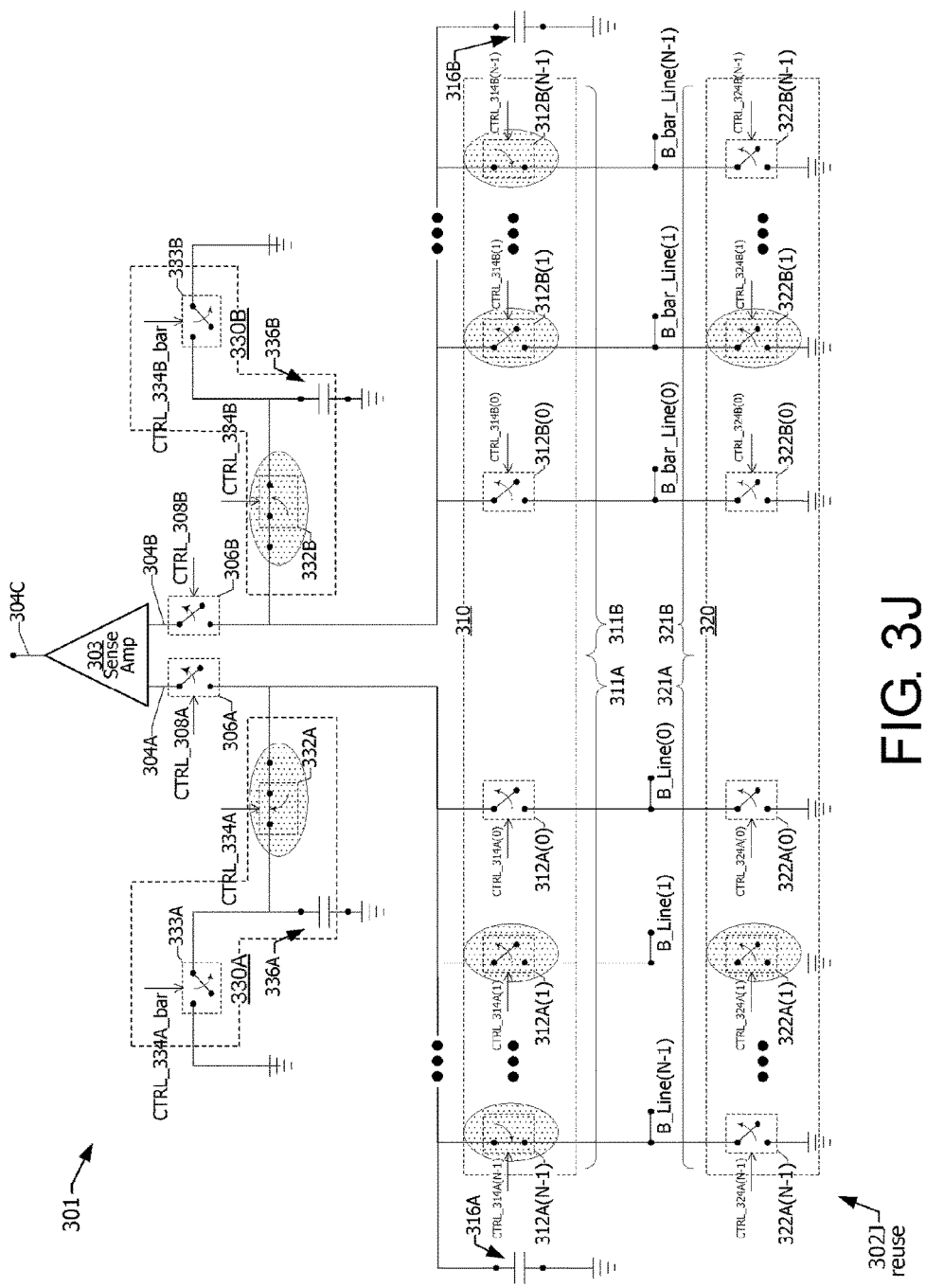

In FIG. 3J, memory device 301 is shown in reuse phase 302J, which corresponds, e.g., to reuse phase 212A of FIG. 2.

In reuse phase 302J, drain switches 322A(1) and 322B(1) are controlled to be open. Consequently, bit line B_Line(1) and bit_bar line B_bar_Line(1) are disconnected from ground. Leg switches 312A(1) and 312B(1) are controlled to be open. Consequently, bit line B_Line(1) and bit_bar line B_bar_Line(1) are disconnected from corresponding branched lines 309A-309B. Leg switches 312A(N−1) and 312B(N−1) are controlled to be closed. Consequently, bit line B_Line(N−1) and bit_bar line B_bar_Line(N−1) are connected to corresponding branched lines 309A-309B to form new first and second line pairs.

Also in reuse phase 302J, recycle switches 332A-332B are controlled to be closed, thereby connecting capacitors 336A-336B to corresponding branched line 309A of the first line pair (and thus, in reuse phase 302J, also to bit line B_Line(N−1)) and branched line 309B of the second line pair (and thus, in reuse phase 302J, also to bit_bar line B_bar_Line(N−1)). Consequently, the first and second charges stored in capacitors 336A-336B are transferred onto corresponding the first and second line pairs.

In some embodiments, in reuse phases 302J and 302E and in corresponding pre-fill phases 302A and 302F, leg switches 312A(0)-312A(N−1) and 312B(0)-312B(N−1) are controlled to be open.

Figure 4:
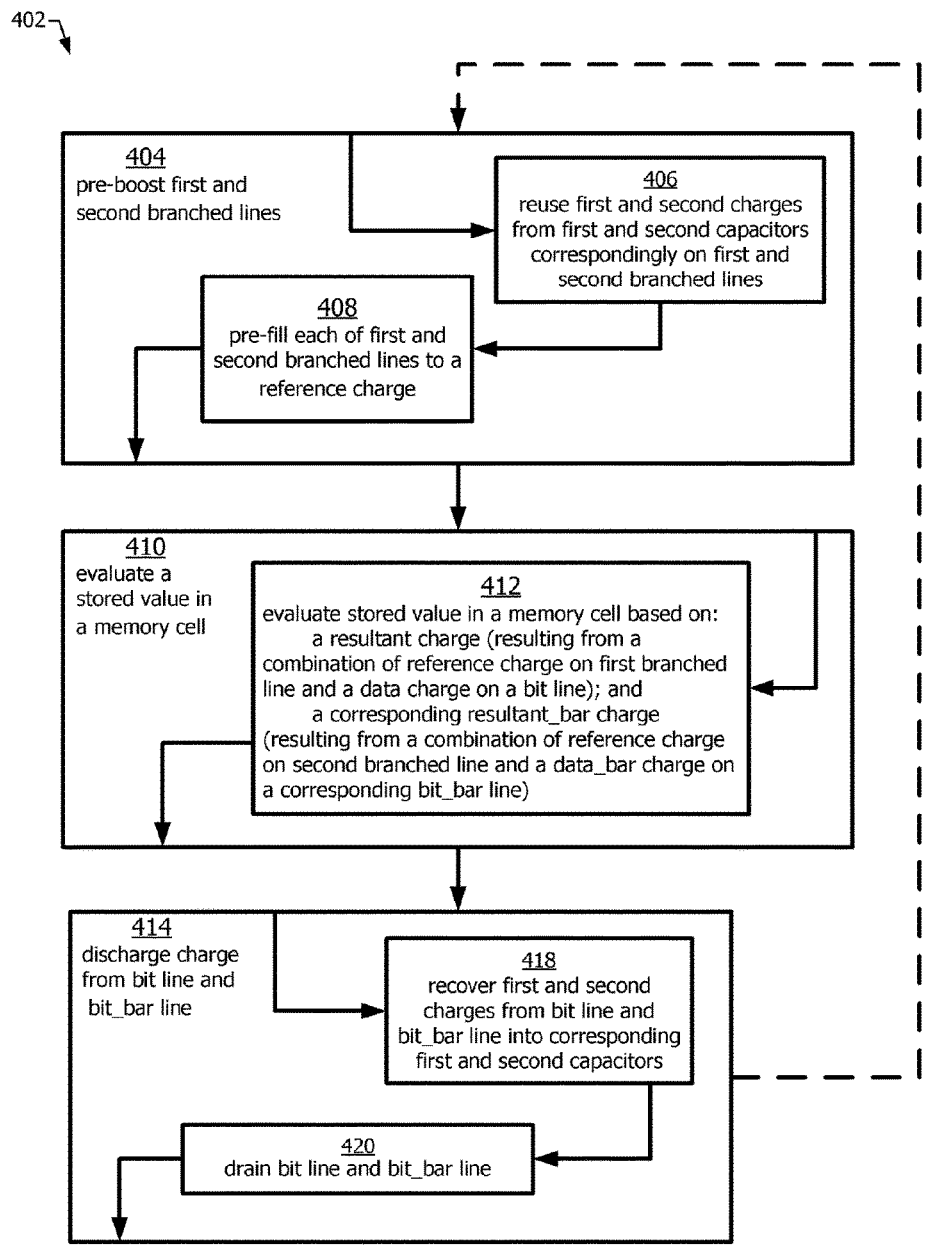
FIG. 4 is a flowchart of a method of reading data from a memory cell, in accordance with at least one embodiment of the present disclosure.

FIG. 4 is a flowchart of a method 402 of reading a memory cell, in accordance with at least one embodiment of the present disclosure.

At block 404, the first and second branched lines are pre-boosted. Block 404 corresponds, e.g., to pre-boost phases 204A and 204B of FIG. Block 404 includes blocks 406 and 408. At block 406, first and second charges from the first and second capacitors are transferred ('reused') on the first and second branched lines. Block 404 corresponds, e.g., to reuse phases 302E and 302J of corresponding FIGS. 3E and 3J. From block 406, flow proceeds to block 408. At block 408, each of the first and second branched lines is pre-filled. Block 408 corresponds, e.g., to phases 302A and 302F of corresponding FIGS. 3A and 3F. From block 404, flow proceeds to a block 410.

At block 410, the stored value in a memory cell is evaluated by the sense amplifier. Block 410 corresponds, e.g., to phases 206A and 206B of FIG. 2. Block 410 includes a block 412. At block 412, the stored value in a memory cell is evaluated by the sense amplifier based on: a resultant charge (resulting from a combination of reference charge on first branched line and a data charge on a bit line); and a corresponding resultant_bar charge (resulting from a combination of reference charge on second branched line and a data_bar charge on a corresponding bit_bar line). Block 412 corresponds, e.g., to phases 302B and 302G of corresponding FIGS. 3B and 3G. From block 410, flow proceeds to a block 414.

At block 414, charge is discharged from the selected bit line and the corresponding selected bit_bar line. Block 414 corresponds, e.g., to phases 210A and 210B of FIG. 2. Block 414 includes blocks 418 and 420. At block 418, first and second charges are transferred ('recovered') form the selected bit line and the corresponding selected bit_bar line into the corresponding first and second capacitors. Block 418 corresponds, e.g., to phases 302C and 302H of corresponding FIGS. 3C and 3H. From block 418, flow proceeds to block 420.

At block 420, the selected bit line and the corresponding selected bit_bar line are drained to ground. Block 420 corresponds, e.g., to phases 202D and 202J of corresponding FIGS. 2D and 2J.

In some embodiments, as noted, read operations 202A-202B are instances of a cyclic general read cycle. Accordingly, in some embodiments, flow proceeds to loop from block 414 to block 404, as indicated by the dashed line extending from block 414 to block 404.

One of ordinary skill in the art would recognize that operations are able to be removed or that additional operations are able to be added to at least one of the above-noted methods without departing from the scope of this description. One of ordinary skill in the art would also recognize that an order of operations in at least one of the above-noted methods is able to be adjusted without departing from the scope of this description.

In an embodiments, a semiconductor device includes: a sense amplifier; a branched line selectively connectable to the amplifier; a recycling arrangement selectively connectable to the branched line; an array of bit lines connected to corresponding memory cells; a multiplexer configured to selectively connect the branched line to a selected one of the memory cells through a corresponding line amongst the array of bit lines; and a controller configured to control the recycling arrangement and the multiplexer to perform intra-sense-amplifier recycling of a gleaned amount of charge (gleaned charge) recovered from a first read operation to a second read operation.

In an embodiment, the controller is further configured to perform intra-sense-amplifier recycling by: permitting, during a recovery phase in which the gleaned charge is recovered, flow of charge (charge-flow) between the recycling arrangement and the branched line; interrupting, during a drainage phase in which the gleaned charge is preserved, charge-flow between the recycling arrangement and the branched line; and permitting, during a reuse phase in which the gleaned charge is reused, charge-flow between the recycling arrangement and the branched line. In an embodiment, the sense amplifier includes first and second terminals; the branched line is selectively connectable to the first terminal of the sense amplifier; the controller, during the reuse phase, is further configured to disconnect the first terminal of the sense amplifier from the branched line, connect a selected one of the bit lines to the branched line to form a line pair, and permit charge-flow between the recycling arrangement and the line pair and thereby permit charge to be transferred from the line pair into the recycling arrangement. In an embodiment, a result of the reuse phase is that a residual amount of charge (residual charge) remains on the line pair; and the controller, during the drainage phase, is further configured to interrupt charge-flow between the line pair and the recycling arrangement, and cause the residual charge on the line pair to be reduced. In an embodiment, the sense amplifier includes first and second terminals; and the controller, during a pre-fill phase, is further configured to interrupt charge-flow between the branched line and the recycling arrangement, and cause the branched line to be connected to the first terminal of the sense amplifier; and the sense amplifier is configured to adjust a charge-level on the branched line according to a reference charge. In an embodiment, the controller, during an evaluating phase, is further configured to cause the branched line to be connected to a selected one of the bit lines to form a line pair and thereby produce a resultant charge, the resultant charge resulting from a combination of the reference charge on the branched line and a data charge on a bit line of the memory cell; and the sense amplifier is configured to compare the resultant charge against a reference signal at the sense amplifier. In an embodiment, the recycling arrangement includes: a capacitor; and a recycle switch, a first terminal of the recycle switch being connected to a first terminal of the capacitor, and a second terminal of the recycle switch being connected to the branched line, and a control terminal of the recycle switch being connected so as to receive control signals from the controller.

In an embodiment, a method (of reading a memory device) includes: disconnecting a sense amplifier from first and second branched lines; connecting first and second capacitors correspondingly to the first and second branched lines; recovering first and second charges correspondingly from first and second bit lines associated with corresponding first and second memory cells of the memory device into corresponding first and second capacitors; disconnecting the first and second capacitors correspondingly from the first and second branched lines; draining the first and second bit lines; reconnecting the first and second capacitors correspondingly to the first and second branched lines; reusing the first and second charge from the first and second capacitors correspondingly onto the first and second branched lines; disconnecting the first and second capacitors correspondingly from the first and second branched lines; reconnecting the sense amplifier to the first and second branched lines; and pre-filling the first and second branched lines to a reference charge. In an embodiment, the recovering the first charge includes: connecting the first bit line to the branched line to form a line pair; connecting the capacitor to the line pair; and transferring the first charge from the line pair into the capacitor. In an embodiment, the transferring leaves a residual amount of charge (residual charge) on the line pair; and the draining includes disconnecting the line pair from the capacitor, and reducing the residual charge on the line pair. In an embodiment, the reducing includes: connecting the line pair directly to ground. In an embodiment, the reusing includes: connecting the second bit line to the branched line; and transferring the first charge from the capacitor onto the branched line. In an embodiment, the pre-filling includes: disconnecting the branched line from the capacitor; connecting the branched line to a selected one of first and second terminals of a sense amplifier; and adjusting a charge-level on the branched line from the first charge to the reference charge. In an embodiment, the evaluating includes: connecting the branched line to the bit line to form a line pair and thereby producing the resultant charge; and comparing the resultant charge against a reference signal at the sense amplifier. In an embodiment, the recovering the second charge includes: connecting the second bit line to the branched line to form a line pair; connecting the capacitor to the line pair; and transferring the second charge to the capacitor from the line pair.

In an embodiment, a memory device includes: a sense amplifier; a branched line connectable to a first terminal of the sense amplifier, the branch line being further connectable through a corresponding one of bit lines of the memory device to a selected one of memory cells of the memory device; a capacitor; a recycle switch configured to connect the capacitor to the branched line during a recovery phase in which a gleaned amount of charge (gleaned charge) is recovered into the capacitor from a first one of the bit lines, connect the capacitor to the branched line during a reuse phase in which the gleaned charge is reused from the capacitor correspondingly onto the branched line while the branched line is connected to a second one of the bit lines, and disconnect the capacitor from the branched line during an evaluation phase in which the first terminal of the sense amplifier is connected to the branched line; and a terminal switch configured to disconnect the branched line from the first terminal during the recovery phase and the reuse phase, and connect the branched line to the first terminal during the evaluation phase. In an embodiment, the memory further includes: a multiplexer configured to selectively connect the branched line to the selected one of the memory cells through the corresponding one of the bit lines; the multiplexer including leg switches to selectively correspondingly connect the branched line to corresponding bit lines. In an embodiment, the memory further includes: a multiplexer configured to selectively connect the branched line to the selected one of the memory cells through the corresponding one of the bit lines; the multiplexer including drain switches to selectively correspondingly connect corresponding ones of the bit lines to ground. In an embodiment, a pre-filling phase follows a reuse phase; and the recycle switch is further configured to disconnect the capacitor from the corresponding branched line during the pre-filling phase in which the branched line is disconnected from the bit lines, and the branched line is pre-filled from a level of the gleaned charge to a level of a reference charge. In an embodiment, an evaluation phase follows the pre-filling phase; and the recycle switch is further configured to disconnect the capacitor from the branched line during the evaluation phase in which the branched line is connected to a corresponding selected one of the bit lines thereby producing a resultant charge, and the resultant charge is compared against a reference signal at the sense amplifier.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a sense amplifier;
   a branched line selectively connectable to the amplifier;
   a recycling arrangement selectively connectable to the branched line;
   an array of bit lines connected to corresponding memory cells;
   a multiplexer configured to selectively connect the branched line to a selected one of the memory cells through a corresponding line amongst the array of bit lines; and
   a controller configured to control the recycling arrangement and the multiplexer to perform intra-sense-amplifier recycling of a gleaned amount of charge (gleaned charge) recovered from a first read operation to a second read operation.

2. The semiconductor device of claim 1, wherein the controller is further configured to perform intra-sense-amplifier recycling by:
   permitting, during a recovery phase in which the gleaned charge is recovered, flow of charge (charge-flow) between the recycling arrangement and the branched line;
   interrupting, during a drainage phase in which the gleaned charge is preserved, charge-flow between the recycling arrangement and the branched line; and
   permitting, during a reuse phase in which the gleaned charge is reused, charge-flow between the recycling arrangement and the branched line.

3. The semiconductor device of claim 2, wherein:
   the sense amplifier includes first and second terminals;
   the branched line is selectively connectable to the first terminal of the sense amplifier;
   the controller, during the reuse phase, is further configured to:
      disconnect the first terminal of the sense amplifier from the branched line;
      connect a selected one of the bit lines to the branched line to form a line pair;
      permit charge-flow between the recycling arrangement and the line pair and thereby permit charge to be transferred from the line pair into the recycling arrangement.

4. The semiconductor device of claim 3, wherein:
   a result of the reuse phase is that a residual amount of charge (residual charge) remains on the line pair; and
   the controller, during the drainage phase, is further configured to:
      interrupt charge-flow between the line pair and the recycling arrangement; and
      cause the residual charge on the line pair to be reduced.

5. The semiconductor device of claim 1, wherein:
   the sense amplifier includes first and second terminals; and
   the controller, during a pre-fill phase, is further configured to:
      interrupt charge-flow between the branched line and the recycling arrangement; and
      cause the branched line to be connected to the first terminal of the sense amplifier; and
   the sense amplifier is configured to:
      adjust a charge-level on the branched line according to a reference charge.

6. The semiconductor device of claim 1, wherein:
   the controller, during an evaluating phase, is further configured to:
      cause the branched line to be connected to a selected one of the bit lines to form a line pair and thereby produce a resultant charge;
         the resultant charge resulting from a combination of a reference charge on the branched line and a data charge on a bit line of the memory cell; and
   the sense amplifier is configured to:
      compare the resultant charge against a reference signal at the sense amplifier.

7. The semiconductor device of claim 1, wherein the recycling arrangement includes:
   a capacitor; and
   a recycle switch, a first terminal of the recycle switch being connected to a first terminal of the capacitor, and a second terminal of the recycle switch being connected to the branched line, and a control terminal of the recycle switch being connected so as to receive control signals from the controller.

8. A method of reading a memory device, the method comprising:
   disconnecting a sense amplifier from first and second branched lines;
   connecting first and second capacitors correspondingly to the first and second branched lines;
   recovering first and second charges correspondingly from first and second bit lines associated with corresponding first and second memory cells of the memory device into corresponding first and second capacitors;
   disconnecting the first and second capacitors correspondingly from the first and second branched lines;
   draining the first and second bit lines;
   reconnecting the first and second capacitors correspondingly to the first and second branched lines;
   reusing the first and second charges from the first and second capacitors correspondingly onto the first and second branched lines;
   disconnecting the first and second capacitors correspondingly from the first and second branched lines;
   reconnecting the sense amplifier to the first and second branched lines; and
   pre-filling the first and second branched lines to a reference charge.

9. The method of claim 8, wherein the recovering the first charge includes:

connecting the first bit line to the branched line to form a line pair;
connecting the capacitor to the line pair; and
transferring the first charge from the line pair into the capacitor.

10. The method of claim 9, wherein:
the transferring leaves a residual amount of charge (residual charge) on the line pair; and
the draining includes:
  disconnecting the line pair from the capacitor; and
  reducing the residual charge on the line pair.

11. The method of claim 10, wherein the reducing includes:
connecting the line pair directly to ground.

12. The method of claim 8, wherein the reusing includes:
connecting the second bit line to the branched line; and
transferring the first charge from the capacitor onto the branched line.

13. The method of claim 12, wherein the pre-filling includes:
disconnecting the branched line from the capacitor;
connecting the branched line to a selected one of first and second terminals of a sense amplifier; and
adjusting a charge-level on the branched line from the first charge to the reference charge.

14. The method of claim 13, wherein the evaluating includes:
connecting the branched line to the bit line to form a line pair and thereby producing the resultant charge; and
comparing the resultant charge against a reference signal at the sense amplifier.

15. The method of claim 8, wherein the recovering the second charge includes:
connecting the second bit line to the branched line to form a line pair;
connecting the capacitor to the line pair; and
transferring the second charge to the capacitor from the line pair.

16. A memory device comprising:
a sense amplifier;
a branched line connectable to a first terminal of the sense amplifier, the branch line being further connectable through a corresponding one of bit lines of the memory device to a selected one of memory cells of the memory device;
a capacitor;
a recycle switch configured to:
  connect the capacitor to the branched line during a recovery phase in which a gleaned amount of charge (gleaned charge) is recovered into the capacitor from a first one of the bit lines;
  connect the capacitor to the branched line during a reuse phase in which the gleaned charge is reused from the capacitor correspondingly onto the branched line while the branched line is connected to a second one of the bit lines; and
  disconnect the capacitor from the branched line during an evaluation phase in which the first terminal of the sense amplifier is connected to the branched line; and
a terminal switch configured to:
  disconnect the branched line from the first terminal during the recovery phase and the reuse phase; and
  connect the branched line to the first terminal during the evaluation phase.

17. The memory device of claim 16, further comprising:
a multiplexer configured to selectively connect the branched line to the selected one of the memory cells through the corresponding one of the bit lines;
the multiplexer including leg switches to selectively correspondingly connect the branched line to corresponding bit lines.

18. The memory device of claim 16, further comprising:
a multiplexer configured to selectively connect the branched line to the selected one of the memory cells through the corresponding one of the bit lines;
the multiplexer including drain switches to selectively correspondingly connect corresponding ones of the bit lines to ground.

19. The memory device of claim 16, wherein:
a pre-filling phase follows a reuse phase; and
the recycle switch is further configured to:
  disconnect the capacitor from the corresponding branched line during the pre-filling phase in which:
    the branched line is disconnected from the bit lines; and
    the branched line is pre-filled from a level of the gleaned charge to a level of a reference charge.

20. The memory device of claim 18, wherein:
an evaluation phase follows the pre-filling phase; and
the recycle switch is further configured to:
  disconnect the capacitor from the branched line during the evaluation phase in which:
    the branched line is connected to a corresponding selected one of the bit lines thereby producing a resultant charge; and
    the resultant charge is compared against a reference signal at the sense amplifier.

* * * * *